United States Patent [19]

Hinoshita et al.

[11] Patent Number: 5,528,152

[45] Date of Patent: Jun. 18, 1996

[54] METHOD FOR MEASURING TRANSMISSION PARAMETERS OF BALANCED PAIR

[75] Inventors: Shinji Hinoshita, Ibaraki; Nobuo Ohmori, Miyagi, both of Japan

[73] Assignee: Hitachi Cable, Ltd., Tokyo, Japan

[21] Appl. No.: 398,568

[22] Filed: Mar. 3, 1995

[30] Foreign Application Priority Data

Apr. 20, 1994 [JP] Japan ..................................... 6-081391
Jun. 8, 1994 [JP] Japan ..................................... 6-126297

[51] Int. Cl.⁶ .................................................. G01R 31/02
[52] U.S. Cl. ........................................... 324/539; 324/66
[58] Field of Search ........................... 324/539, 66, 133, 324/616; 379/2, 30

[56] References Cited

U.S. PATENT DOCUMENTS 5,168,237 12/1992 Fieau et al. .................. 324/539 X
5,402,073 3/1995 Ross ................................. 324/539
5,444,759 8/1995 Vogt, III et al. ................... 379/30

*Primary Examiner*—Kenneth A. Wieder
*Assistant Examiner*—Diep Do
*Attorney, Agent, or Firm*—Helfgott & Karas

[57] ABSTRACT

In a method for measuring transmission parameters of a balanced pair, a unbalanced type equipment which is widely used as compared to a balanced type equipment which is not used in practical is used. In the measurement, the balanced pair is connected to the unbalanced type equipment or via a unbalanced/balanced type transformer thereto at the measuring end, wherein predetermined terminated states are set at the measuring and far-ends to measure input admittances dependent on the terminated states. A characteristic impedance and a propagation constant for the transmission parameters are calculated from predetermined equations into which the measured input admittances are substituted.

5 Claims, 10 Drawing Sheets

71 UNBALANCED/BALANCED TRANSFORMER

71 UNBALANCED/BALANCED TRANSFORMER

METHOD FOR MEASURING TRANSMISSION PARAMETERS OF BALANCED PAIR

FIELD OF THE INVENTION

The invention relates to a method for measuring transmission parameters of a characteristic impedance and a propagation constant of a balanced pair, and more particularly to, a method for measuring transmission parameters at a high frequency band by using a unbalanced type measuring equipment (defined "a unbalanced type equipment" hereinafter).

BACKGROUND OF THE INVENTION

A conventional method for measuring transmission parameters of a pair type cable composed of balanced pairs comprises the steps of connecting a measuring equipment to a near-end of a balanced pair, while opening a far-end of the balanced pair, and measuring a far-end-open input admittance Yf or impedance Zif of the balanced pair. The conventional method for measuring transmission parameters of a pair type cable composed of balanced pairs further comprises the steps of short-circuiting a far-end of the balanced pair, and measuring a far-end-short input impedance Zs (Zis) of the balanced pair.

The measured values are substituted into the equations (1) and (2) or (1') and (2').

$$\frac{1}{Zb} = Yb = \sqrt{\frac{Yf}{Zs}} \quad (1)$$

$$\gamma b = \frac{1}{L} \tanh^{-1} \sqrt{Yf \cdot Zs} \quad (2)$$

where Zb is a characteristic impedance, $\gamma b$ is a propagation constant ($\gamma = \alpha + j\beta$, where $\alpha$ is an attenuation constant, and $\beta$ is a phase constant), and L is a length between the near-and far-ends of the balanced pair.

$$Zo^2 = Zif \cdot Zis \quad (1')$$

$$(\tanh\gamma L)^2 = \frac{Zis}{Zif} \quad (2')$$

where Zo is a characteristic impedance, $\gamma$ is a propagation constant ($\gamma = \alpha + j\beta$, where a is an attenuation constant, and $\beta$ is a phase constant), and L is a length between the near-and far-ends of the balanced pair.

In the conventional method for measuring transmission parameters of a pair type cable composed of balanced pairs, a balanced type equipment is used.

These days, the transmission rate of digital signals transmitted through pair type cables has become high, wherein transmission frequencies of the digital signals are at a high frequency band. Therefore, the transmission parameters are required to be measured at the high frequency band.

In the conventional method for measuring transmission parameters of a pair type cable composed of balanced pairs, however, there is a disadvantage in that a balance type equipment having a good balance degree at a high frequency band is difficult to be commercially manufactured. Actually, such balanced type equipments have not been manufactured, but unbalanced type equipments have been widely used at a high frequency band for the purpose other than a method for measuring high frequency parameters of a balanced pair.

SUMMARY OF THE INVENTION

Accordingly, it is an object of the invention to provide a method for measuring high frequency transmission parameters of a balanced pair in which a unbalanced type equipment can be used.

According to the first feature of the invention, a method for measuring transmission parameters of a balanced pair, comprises the steps of:

connecting a unbalanced terminal of a unbalanced/balanced type transformer to a unbalanced type equipment;

opening a balanced terminal of the unbalanced/balanced transformer to measure a balanced terminal-open input admittance Zitf by the unbalanced type equipment;

short-circuiting the balanced terminal to measure a balanced terminal-short input admittance Zits by said unbalanced type equipment;

terminating the balanced terminal with a terminating resistance R to measure a balanced terminal resistance-terminated input impedance Zitr by the unbalanced type equipment;

connecting a balanced pair at a near-end thereof to the balanced terminal to measure a far-end-open input admittance Zitcf by the unbalanced type equipment, the balanced pair being open at a far-end thereof;

short-circuiting the far-end of the balanced pair connected to the balanced terminal to measure a far-end-short admittance Zitcs by the unbalanced type equipment; and calculating a characteristic impedance Zo and a propagation constant $\gamma$ for the transmission parameters in accordance with equations defined below:

$$Zo^2 = R^2 \left( \frac{Zitr - Zitf}{Zitr - Zits} \right)^2 \cdot \frac{Zitcf - Zits}{Zitcf - Zitf} \cdot \frac{Zitcs - Zits}{Zitcf - Zitf} \quad (14)$$

$$(\tanh\gamma L)^2 = \frac{Zitcf - Zitf}{Zitcf - Zits} \cdot \frac{Zitcs - Zits}{Zitcs - Zitf} \quad (15)$$

According to the second feature of the invention, a method for measuring transmission parameters of a balanced pair, comprises the steps of:

providing a balanced pair of a length L having a measuring end and a far-end opposite to the measuring end, the balanced pair comprising first and second conductors and contained together with other balanced pairs having remaining conductors in a pair type cable;

providing a unbalanced type equipment having a signal terminal (defined "signal terminal" here in after) and a earth return ground terminal (defined "ground terminal" here in after);

setting the balanced pair to be a first terminated state in which the first conductor is connected to the signal terminal, and the second conductor is connected together with the remaining conductors to the ground terminal, respectively, at the measuring end, while the balanced pair are short-circuited, and the remaining conductors are open, respectively, at the far-end, thereby measuring an input admittance Yfs;

setting the balanced pair to be a second terminated state in which the first conductor is connected to the signal terminal, anu the second conductor is connected together with the remaining conductors to the ground terminal, respectively, at the measuring end, while the balanced pair and the remaining conductors are open at the far-end, thereby measuring an input admittance Yff;

setting the balanced pair to be a third terminated state in which the first and second conductors are connected to the signal terminal, and the remaining conductors are connected to the ground terminal, respectively, at the measuring end, while the first and second conductors are short-circuited, and the remaining conductors are open, respectively, at the far-end, thereby measuring an input admittance Yuf; and calculating a characteristic impedance Zb and a propagation constant b for the transmission parameters in accordance with equations defined below:

$$\frac{1}{Zb} = Yb = \sqrt{\left(Yff - \frac{1}{4} Yuf\right)\left(Yfs - \frac{1}{4} Yus\right)} \quad (21)$$

$$\gamma b = \frac{1}{L} \tanh^{-1} \sqrt{\frac{Yff - \frac{1}{4} Yuf}{Yfs - \frac{1}{4} Yus}} \quad (22)$$

According to the third feature of the invention, a method for measuring transmission parameters of a balanced pair, comprises the steps of:

providing a balanced pair of a length L having a measuring end and a far-end opposite to the measuring end, the balanced pair comprising first and second conductors and contained together with other balanced pairs having remaining conductors in a pair type cable;

providing a unbalanced type equipment having a signal terminal and a ground terminal;

setting the balanced pair to be a first terminated state in which the first conductor is connected to the signal terminal, and the second conductor is connected together with the remaining conductors to the ground terminal, respectively, at the measuring end, while the balanced pair and the remaining conductors are short-circuited at the far end, thereby measuring an input admittance Y'fs;

setting the balanced pair to be a second terminated state in which the first conductor is connected to the signal terminal, and the second conductor is connected together with the remaining conductors to the ground terminal, respectively, at the measuring end, while the balanced pair and the remaining conductors are open at the far-end, thereby measuring an input admittance Yff;

setting the balanced pair to be a third terminated state in which the first and second conductors are connected to said signal terminal, and the remaining conductors are connected to the ground terminal, respectively, at the measuring end, while the first and second conductors are short-circuited, and the remaing conductors are open, respectively, at the far-end, thereby measuring an input admittance Yuf;

setting the balanced pair to be a fourth terminated state in which the first and second conductors are connected to the signal terminal, and the remaining conductors are connected to the ground terminal, respectively, at the measuring end, while the first and second conductors and the remaining conductors are short-circuited at the far-end, thereby measuring an input admittance Yus; and calculating a characterisnc impedance Zb and a propagation constant $\gamma b$ for the transmission parameters in accordance with equations defined below:

$$\frac{1}{Zb} = Yb = \sqrt{\left(Yff - \frac{1}{4} Yuf\right)\left(Yfs - \frac{1}{4} Yus\right)} \quad (26)$$

$$\gamma b = \frac{1}{L} \tanh^{-1} \sqrt{\frac{Yff - \frac{1}{4} Yuf}{Yfs - \frac{1}{4} Yus}} \quad (27)$$

BRIEF DESCRIPTION OF THE DRAWINGS

The invention will be explained in more detail in conjunction with appended drawings, wherein.

DESCRIPTION OF THE PREFERRED EMBODIMENTS

Before describing a method for measuring high frequency parameters of a balanced pair in the preferred embodiments according to the invention, the conventional method for measuring transmission parameters of a pair type cable composed of balanced pairs will be again explained.

Figure 1A:
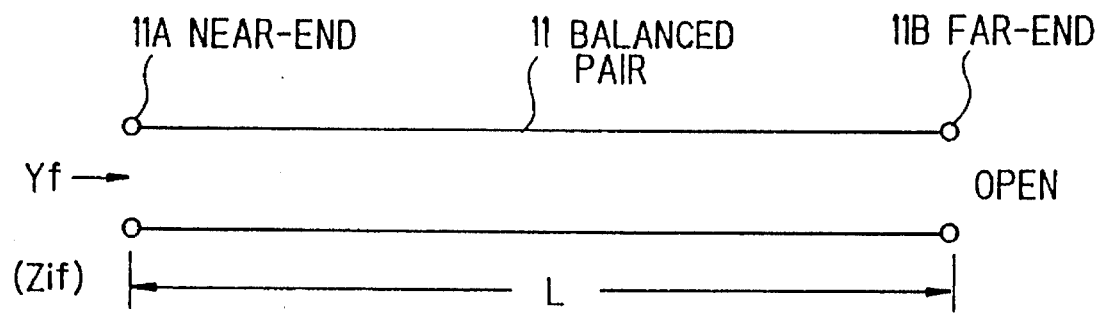
FIGS. 1A and 1B are circuit diagrams showing a conventional method for measuring transmission parameters of a balanced pair.

FIG. 1A shows a balanced pair 11 having open near-and far-ends 11A and 11B. A balanced type equipment (not shown) is connected to the open near-end 11A of the balanced pair 11 to measure a far-end-open input admittance Yf or a far-end-open input impedance Zif.

Figure 1B:
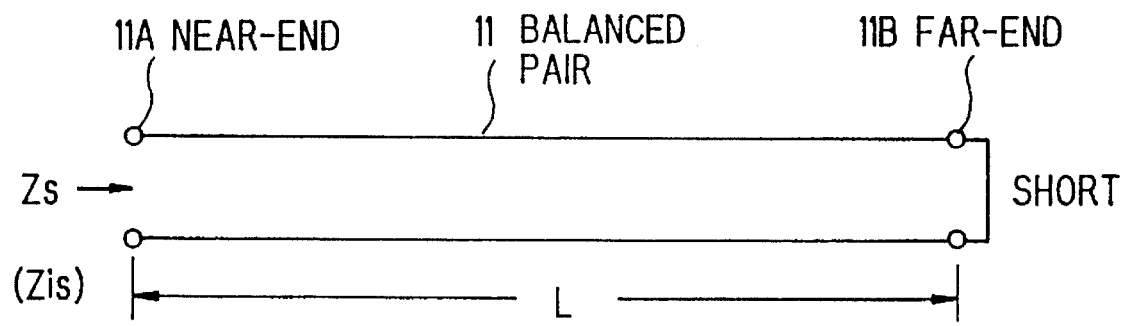

FIG. 1B shows a balanced pair 11 having an open near-end 11A and a short far-end 11B. A balanced type equipment (not shown) is connected to the open near-end 11A of the balanced pair 11 to measure a far-end-short input impedance Zs (Zis).

As described before, the measured values are substituted into the equations (1) and (2) or (1') and (2').

Next, first to third principles of the invention will be explained.

(1) the first principle using a unbalanced/balanced transformer

Figure 2A:
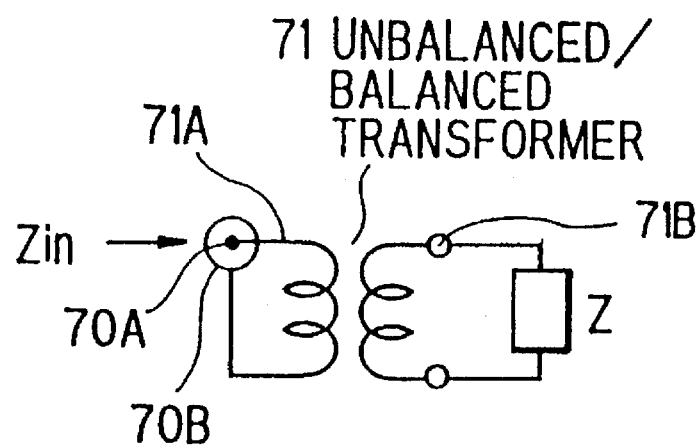
FIGS. 2A and 2B are an equivalent circuit and a four terminal constant circuit explaining a method for measuring transmission parameters of a balanced pair in a first preferred embodiment according to the invention.

In FIG. 2A, a unbalanced/balanced transformer 71 having a unbalanced end 71A and a balanced end 71B is shown, wherein the unbalanced end 71A is connected across the signal and the ground terminals 70A (center conductor) and 70B (outer conductor) of an measuring equipment (not shown), and the balanced end 71B is connected across an impedance Z.

Figure 2B:
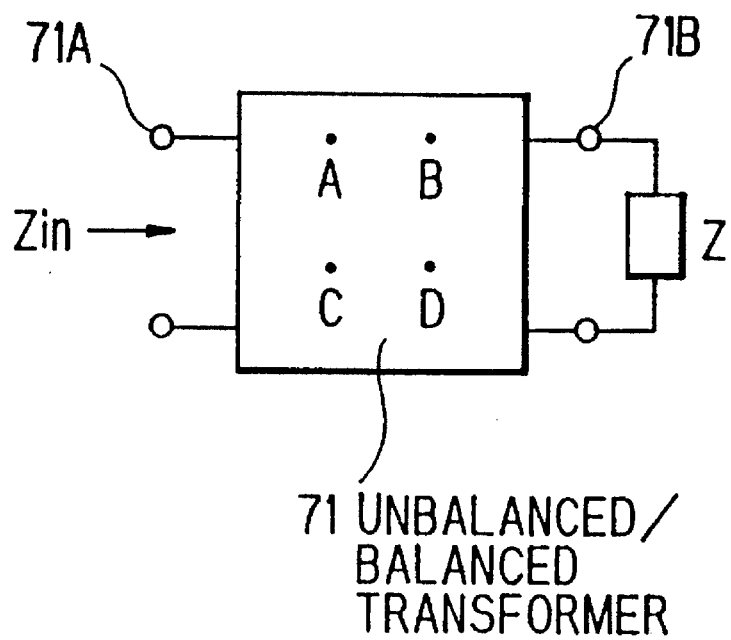

In FIG. 2B, the unbalanced/balanced transformer 71 is shown in an equivalent circuit using an A, B, C, and D matrix (F matrix). Thus, an input impedance Zin at the unbalanced end 71A is defined by the equation (3).

$$Zin=(A\cdot Z+B)/(C\cdot Z+D) \tag{3}$$

This is explained, for instance, on page 85 of "Communication Transmission (Tsushin Denso)" editted by the Institute of Electronics, Information and Communication (IEICEJ) and published by Corona, Ltd., in Tokyo, Japan.

In accordance with the equation (3), the states as shown in FIGS. 3A to 3E will be discussed.

Figure 3A:
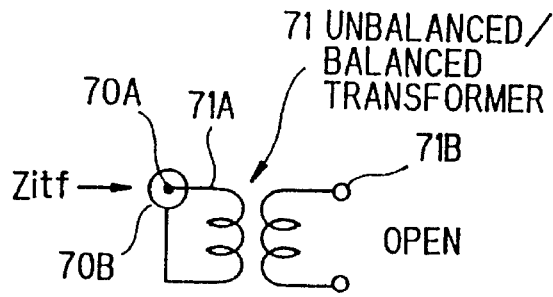
FIGS. 3A to 3E are circuit diagrams showing five measuring circuits in the first preferred embodiment.

(a) FIG. 3A

The equation (4) is obtained, because Z infinity (Z=∞), when the balanced end 71B is open.

$$Zitf=A/C \tag{4}$$

Figure 3B:
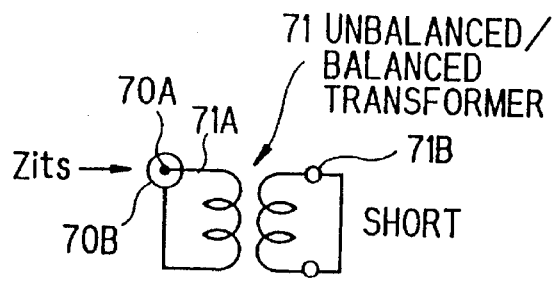

(b) FIG. 3B

The equation (5) is obtained, because Z is zero (Z=0), when the balanced end 71B is short-circuited.

$$Zits=B/D \tag{5}$$

Figure 3C:
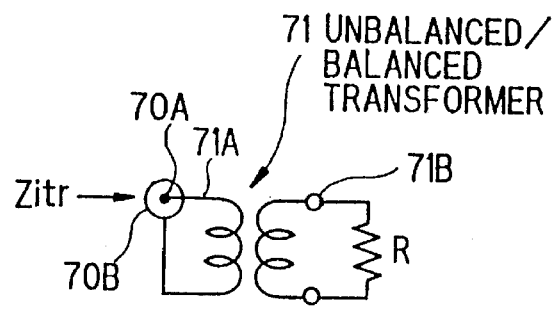

(c) FIG. 3C

The equation (6) is obtained, because Z is R (Z=R), when the balanced end 71B is terminated by a resistance R.

$$Zitr=(A\cdot R+B)/(C\cdot R+D) \tag{6}$$

When the equations (4) and (5) are substituted into the equation (6), the equation (7) is obtained.

$$D/C=R(Zitf-Zitr)/(Zitr-Zits) \tag{7}$$

Figure 3D:
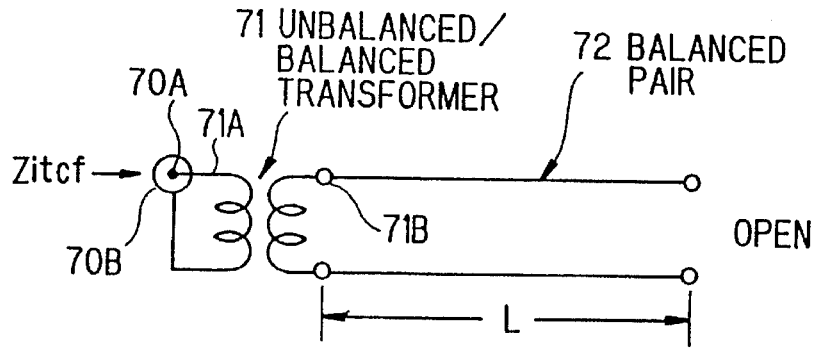

(d) FIG. 3D

The equation (8) is obtained, when the impedance Z is replaced by a balanced pair 72 having an open far-end 72B.

$$Zitcf=(A\cdot Zif+B)/(C\cdot Zif+D) \tag{8}$$

In accordance with the equation (8), the equation (9) is obtained.

$$Zif=(B-Zitcf\cdot D)/(Zitcf\cdot C-A) \tag{9}$$

Figure 3E:
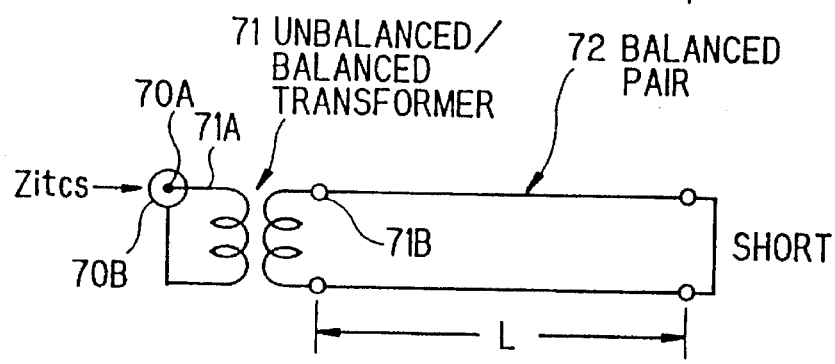

(e) FIG. 3E

The equation (10) is obtained, when impedance Z is replaced by the balanced pair 72 having a short far-end 72B.

$$Zitcs=(A\cdot Zis+B)/(C\cdot Zis+D) \tag{10}$$

In accordance with the equation (10), the equation (11) is obtained.

$$Zis=(B-Zitcs\cdot D)/(Zitcs\cdot C-A) \tag{11}$$

When the equation (1') and (2') are substituted into the equations (9) and (11), and A and B are eliminated in accordance with the equations (4) and (5), the equations (12) and (13) are obtained.

$$Zo^2 = Zif \cdot Zis = \frac{Zits\cdot D - Zitcf\cdot D}{Zitcf\cdot C - Zitf\cdot C} \cdot \frac{Zits\cdot D - Zitcs\cdot D}{Zitcs\cdot C - Zitf\cdot C} \tag{12}$$

$$(\tanh\gamma L)^2 = \frac{Zis}{Zif} = \frac{Zits\cdot D - Zitcs\cdot D}{Zitcs\cdot C - Zitf\cdot C} \cdot \frac{Zitcf\cdot C - Zitf\cdot C}{Zits\cdot D - Zitcf\cdot D} \tag{13}$$

When C and D are eliminated in the equation (7) by the equations (12) and (13), the equations (14) and (15) are obtained.

$$Zo^2 = R^2 \left(\frac{Zitr - Zitf}{Zitr - Zits}\right)^2 \cdot \frac{Zitcf - Zits}{Zitcf - Zitf} \cdot \frac{Zitcs - Zits}{Zitcf - Zitf} \tag{14}$$

$$(\tanh\gamma L)^2 = \frac{Zitcf - Zitf}{Zitcf - Zits} \cdot \frac{Zitcs - Zits}{Zitcs - Zitf} \tag{15}$$

Conventionally, a balanced type equipment is required to directly measure Zif and Zis. In the invention, however, Zif and Zis are not required to be measured, and transmission parameters Zo and γ of a balanced pair are measured in accordance with the measurement of Zitf, Zits, Zitr, Zitcf and Zitcs by using a unbalanced type equipment. Consequently, a measuring frequency range is expanded to an upper limit frequency of a unbalanced type equipment higher than an upper limit frequency of a balanced type equipment or to an upper limit frequency of a unbalanced/balanced transformer.

A unbalanced/balanced transformer has a transmission frequency band, wherein a high frequency band at which the measurement can be carried out is limited by the transmission frequency band.

Figure 4A:
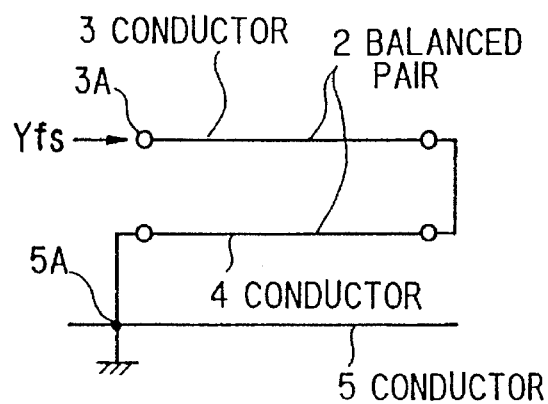
FIGS. 4A to 4C are circuit diagrams showing first to third three terminated states in a method for measuring transmission parameters of a balanced pair in a second preferred embodiment according to the invention.
Figure 4B:
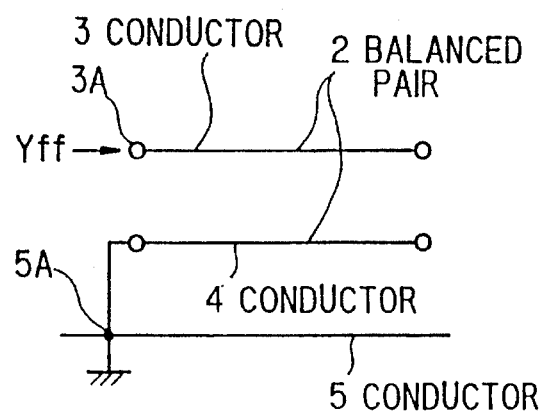
Figure 4C:
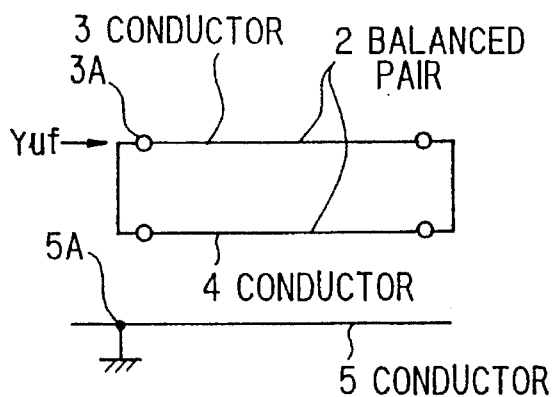
Figure 5A:
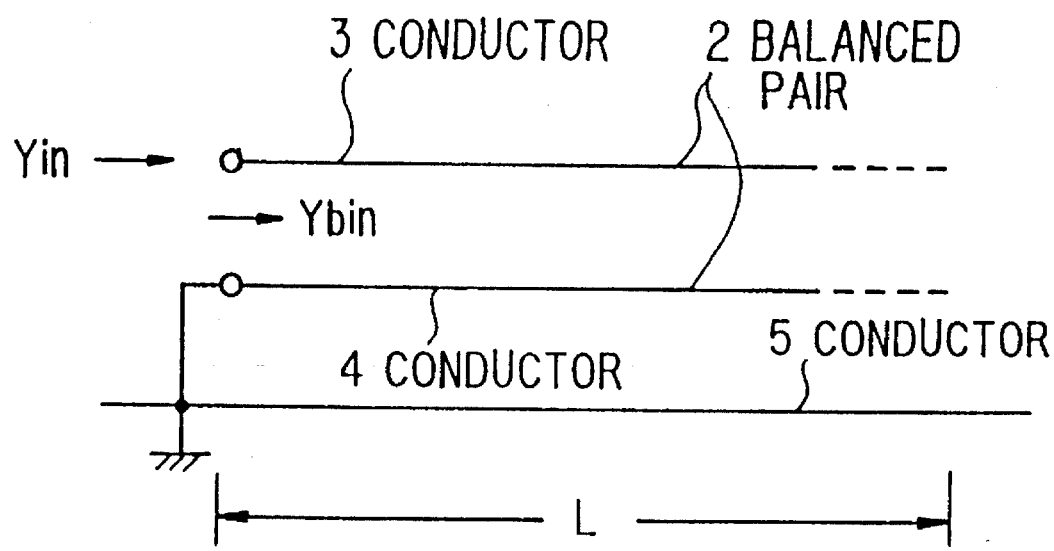
FIGS. 5A and 5B are equivalent circuits of each circuit as shown in FIGS. 4A to 4C.
Figure 5B:
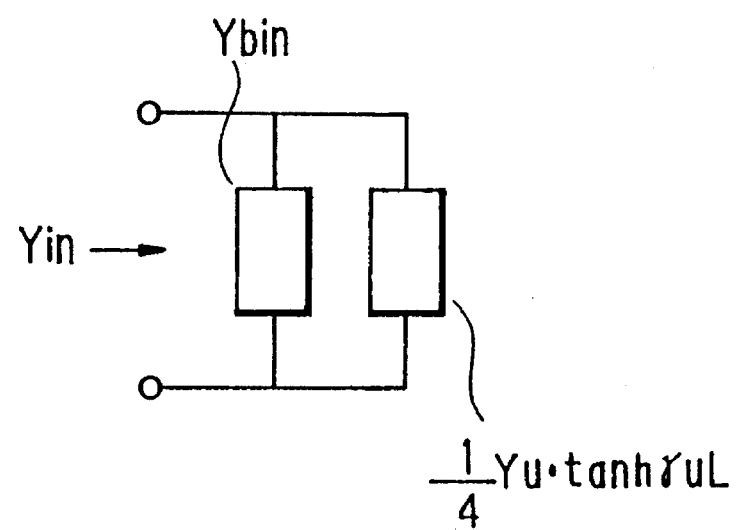

(2) the second principle using no unbalanced/balanced transformer, but a conductor of a pair type cable other than a balanced pair to be measured FIGS. 4A to 4C show first to third unbalanced circuits each having a different terminated state, wherein 2 is a balanced pair, 3 and 4 are conductors for the balanced pair 2, and 5 is another conductor contained together with the balanced pair 2 in a pair type cable (not shown). The first to third unbalanced circuits are generalized by a circuit as shown in FIG. 5A, and equalized by an equivalent circuit as shown in FIG. 5B.

In the equivalent circuit, it is known that the equation (16) is obtained, as described in "Transmission Circuit" published in January of 1968 by Corona, Ltd.

$$Yin = Ybin + (1/4)Yuf \cdot \tanh(\gamma uL) \tag{16}$$
$$= Ybin + (1/4)Yuf$$

(a) FIG. 4A

An input admittance Yfs is obtained in the equation (17) by assuming that Yin is Yfs (Yin=Yfs), and Ybin is Ys which is an input admittance of a short far-end of a balanced pair in the equivalent circuit.

$$Yfs=Yf+(1/4)Yuf \tag{17}$$

(b) FIG. 4B

An input admittance Yff is obtained in the equation (18) by assuming that Yin is Yff (Yin=Yff), and Ybin is Yf (Ybin=Yf) in the equivalent circuit.

$$Yff=Yf+(1/4)Yuf \tag{18}$$

(c) FIG. 4C

An input admittance Yuf is an admittance Yuf of the equivalent circuit.

In accordance with the equation (17), the equation (19) is obtained, and, in accordance with the equation (18), the equation (20) is obtained.

$$1/Zs = Ys = Yfs - (1/4)Yuf \tag{19}$$

$$Yf = Yff - (1/4)Yuf \tag{20}$$

The equations (19) and (20) are substituted into the equations (1) and (2) to provide the equations (21) and (22).

$$\frac{1}{Zb} = Yb = \sqrt{\left(Yff - \frac{1}{4}Yuf\right)\left(Yfs - \frac{1}{4}Yus\right)} \tag{21}$$

$$\gamma b = \frac{1}{L}\tanh^{-1}\sqrt{\frac{Yff - \frac{1}{4}Yuf}{Yfs - \frac{1}{4}Yus}} \tag{22}$$

Thus, transmission parameters of a balanced pair are obtained.

In order to obtain transmission parameters of one balanced pair, it is necessary to measure an input admittance at the above described three terminated states. As shown in FIGS. 4A to 4C, a unbalanced type equipment is connected at signal and ground terminals across the near-end 3A of the conductor 3 and the near-end 5A of the conductor 5.

In the equations (21) and (22), where a length L of the balanced pair 2 to be measured is sufficiently long relative to a measuring wavelength, there is a possibility in which the input admittances Yff and Yuf are capacitive, and the input admittance Yfs is inductive. In this case, the term including Yff and Yuf is for a calculation of the capacitive admittances to minimize a measuring error. On the other hand, the term including Yfs and Yuf of the inductive and capacitive admittances tends to accumulate measuring errors.

(3) the third principle using calculating equations including no co-existence of capacitive and inductive admittances FIGS. 6A to 6D show first to forth unbalanced circuits each having a different terminated state, wherein like parts are indicated by like reference numerals as used in FIGS. 4A to 4C. The first to forth unbalanced circuits are generalized by the circuit as shown in FIG. 5A, and equalized by the equivalent circuit as shown in FIG. 5B.

In the equivalent circuit as shown in FIG. 5B, the equation (16) is obtained, as described before.

$$\begin{aligned}Yin &= Ybin + (1/4)Yuf \cdot \tanh(\gamma uL) \\ &= Ybin + (1/4)Yuf\end{aligned} \tag{16}$$

Figure 6A:
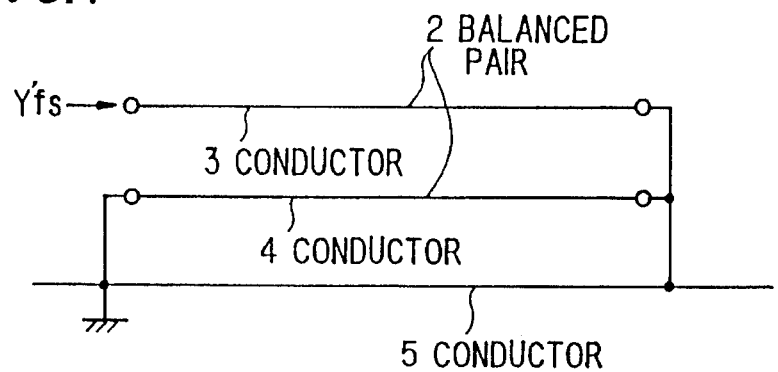
FIGS. 6A to 6D are circuit diagram showing first to fourth terminated states in a method for measuring transmission parameters of a balanced pair in a third preferred embodiment according to the invention.
Figure 6B:
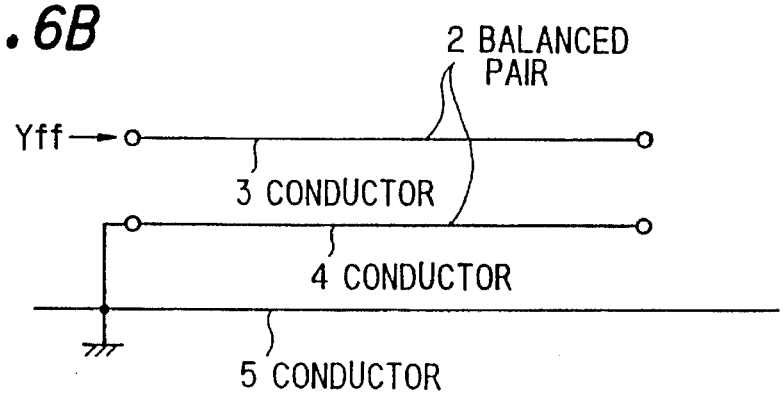

An input admittance Yff of the unbalanced circuit as shown in FIG. 6B is obtained in the equation (17) by assuming that Yin is Yff(Yin=Yff), and Ybin is Yf (Ybin=Yf) in the equivalent circuit as shown in FIG. 5B.

$$Yff = Yf + (1/4)Yuf \tag{17}$$

Figure 6C:
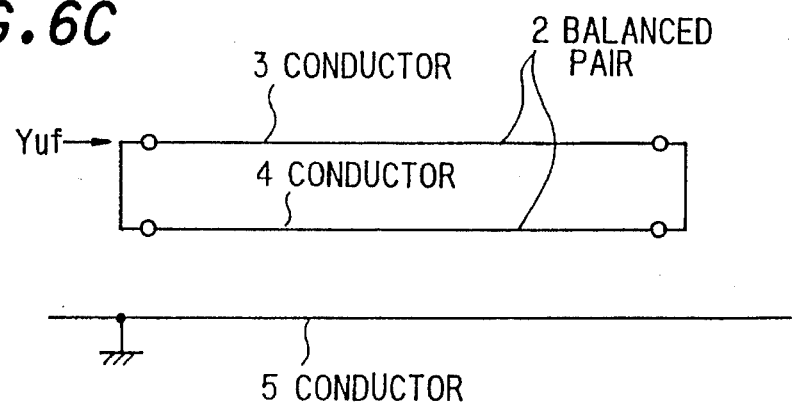

An input admittance Yuf of the unbalanced circuit as shown in FIG. 6C is the admittance Yuf in the equivalent circuit as shown in FIG. 5B.

Figure 6D:
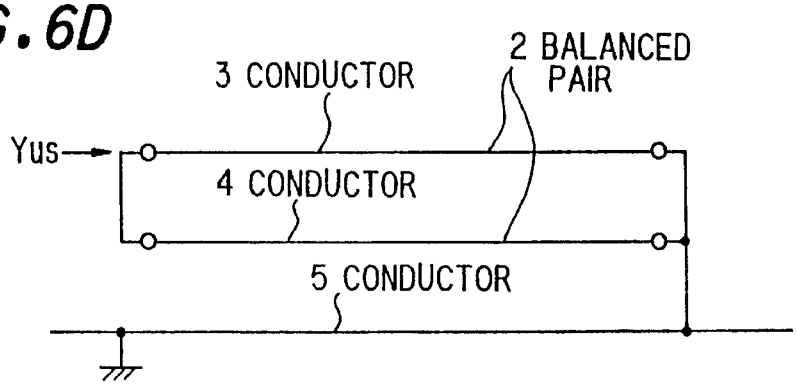

In the same manner, an input admittance of the unbalanced circuit as shown in FIG. 6D is Yus.

Therefore, an input admittance Y'fs of the unbalanced circuit as shown in FIG. 6A is obtained in the equation (23) by assuming that Yin is Y'fs (Yin=Y'fs), and Ybin is Ys (Ybin=Ys).

$$Y'fs = Ys + (1/4)Yus \tag{23}$$

In accordance with the equation (23) and (17), the equations (24) and (25) are obtained, respectively.

$$1/Zs = Ys = Y'fs - (1/4)Yus \tag{24}$$

$$Yf = Yff - (1/4)Yuf \tag{25}$$

In accordance with the equations (24) and (25), the equations (26) and (27) are obtained.

$$\frac{1}{Zb} = Yb = \sqrt{\left(Yff - \frac{1}{4}Yuf\right)\left(Y'fs - \frac{1}{4}Yus\right)} \tag{26}$$

$$\gamma b = \frac{1}{L}\tanh^{-1}\sqrt{\frac{Yff - \frac{1}{4}Yuf}{Y'fs - \frac{1}{4}Yus}} \tag{27}$$

Consequently, transmission parameters of a balanced pair are obtained, wherein the input admittances Y'fs and Yus are inductive, and the input admittances Yff and Yuf are capacitive. Therefore, "Yff(¼)Yuf" is a calculation of the capacitive admittances, and "Y'fs-(¼)Yus" is a calculation of the inductive admittances.

Then, a method for measuring high frequency parameters of a balanced pair in the first preferred embodiment according to the invention will be explained.

In FIGS. 3A to 3E, an unbalanced type equipment is connected across the first and second terminals 70A and 70B of the unbalanced end of the unbalanced/balanced transformer 71 to measure the aforementioned values.

The unbalanced type equipment may be a combination of a network analyzer and a S-parameter measuring apparatus, an impedance measuring apparatus, or an impedance bridge.

In FIGS. 3A to 3C, a balanced end-open input impedance Zitf, a balanced end-short input impedance Zits, and a resistance terminated and balanced end input impedance Zitr are measured by opening, short-circuiting and resistance-terminating the balanced end 71B of the unbalanced/balanced transformer 71, respectively.

In FIGS. 3D and 3E, a balanced pair 72 is connected to the balanced end 71B of the unbalanced/balanced transformer 71, and a far-end open input impedance Zitcf and a far-end short input impedance Zitcs are measured by opening and short-circuiting the far-end of the balanced pair 72, respectively.

It is assumed that the terminating resistance R and the length of the balanced pair 72 are known, wherein it is prefarable that the terminating resistance R is equal in value to a nominal characteristic impedance of the balanced pair 72, and is a non-inductive resistor such as a carbon-sintered solid resistor, etc. including no inductance and capacitance.

The five measured values, the terminating resistance R, and the length L of the balanced pair 72 are substituted into the equations (14) and (15).

$$Zo^2 = R^2\left(\frac{Zitr - Zitf}{Zitr - Zits}\right)^2 \cdot \frac{Zitcf - Zits}{Zitcf - Zitf} \cdot \frac{Zitcs - Zits}{Zitcf - Zitf} \tag{14}$$

$$(\tanh\gamma L)^2 = \frac{Zitcf - Zitf}{Zitcf - Zits} \cdot \frac{Zitcs - Zits}{Zitcs - Zitf} \tag{15}$$

Thus, the transmission parameters Zo and γ are obtained. In the first preferred embodiment, the measurement is possible to be carried out even at an upper limit frequency of the unbalanced type equipment or the unbalanced/balanced transformer 71 which is higher than an upper limit frequency of a balanced type equipment. Conventionally, an upper limit frequency in the measurement using a balanced type equipment is 4 to 10MHz. In the first preferred embodiment, however, the upper limit frequency is increased to be 100 to 150 MHz by appropriately selecting the unbalanced/balanced transformer 71.

A method for measuring transmission parameters of a balanced pair in the second preferred embodiment according to the invention will be explained.

In FIGS. 4A to 4C, a unbalanced type equipment is connected across the measuring terminals 3A and 5A of the unbalanced circuits including the balanced pair 2 of the conductors 3 and 4 and the conductor 5 in the pair type cable (not shown), wherein the signal terminal of the equipment is connected to the terminal 3A, while the ground terminal thereof is connected to the terminal 5A (ground).

In FIG. 4A, an input admittance Yfs is measured in the state in which the far-end of the balanced pair 2 is short-circuited and the far-end of the conductor 5 is open.

In FIG. 4B, an input admittance Yff is measured in the state in which the far-end of the balanced pair 2 is open, and the far-end of the conductor 5 is open.

In FIG. 4C, an input admittance Yuf is measured in the state in which the far-end of the balanced pair is short-circuited, and the far-end of the conductor 5 is open.

The three measured input admittances Yfs, Yff and Yuf are substituted into the equations (21) and (22) to obtain a characteristic impedance Zb and a propagation constant γb of the balanced pair 2.

$$\frac{1}{Zb} = Yb = \sqrt{\left(Yff - \frac{1}{4}Yuf\right)\left(Yfs - \frac{1}{4}Yus\right)} \quad (21)$$

$$\gamma b = \frac{1}{L}\tanh^{-1}\sqrt{\frac{Yff - \frac{1}{4}Yuf}{Yfs - \frac{1}{4}Yus}} \quad (22)$$

As described above, the three input admittances Yfs, Yff and Yuf are measured by the unbalanced type equipment to provide no limitation on a measuring frequency at a high frequency band. Thus, high frequency parameters are precisely measured for the balanced pair 2.

Figure 7:
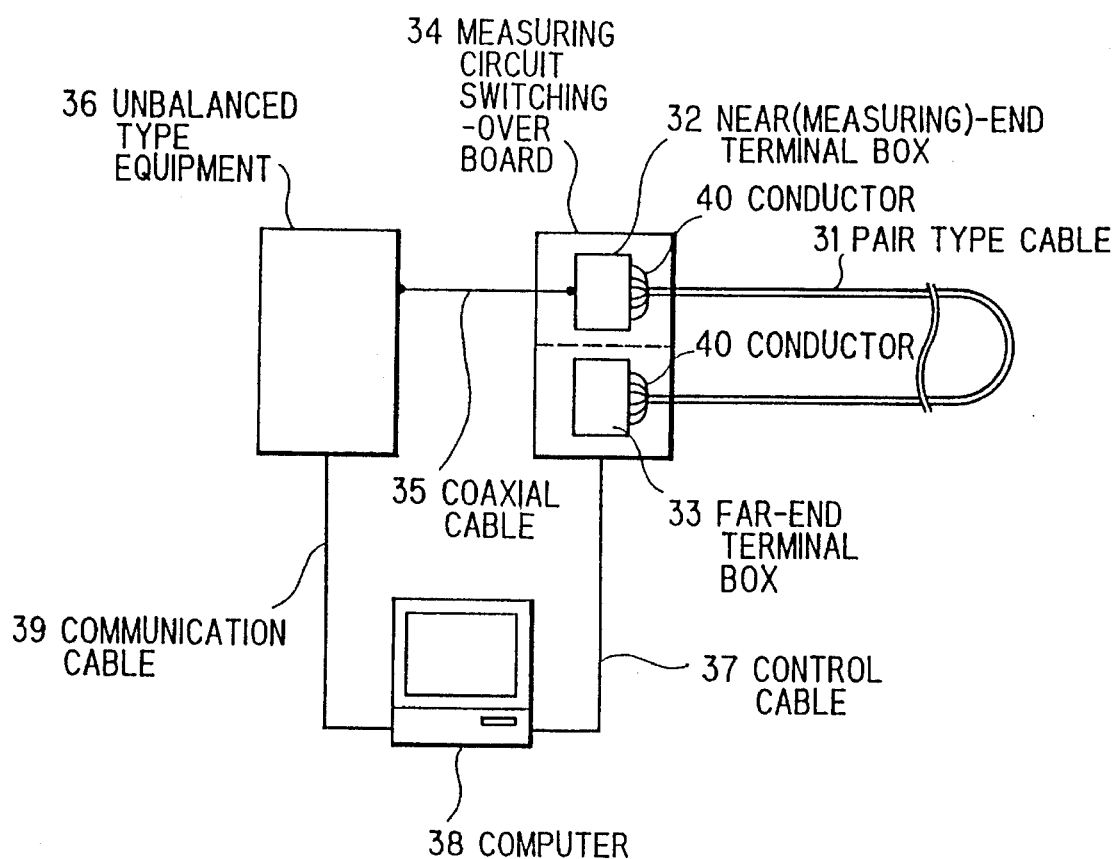
FIG. 7 is a block diagram showing a system for measuring transmission parameters of a balanced pair which is used in the second and third preferred embodiments.

In FIG. 7, a method for measuring high frequency parameters of a balanced pair in the preferred embodiments according to the invention will be explained in more detail.

A system as shown in FIG. 7 comprises a switching board 34 for switching-over measuring circuits, a unbalanced type equipment 36 connected via a coaxial cable 35 to the switching board 34, and a computer (personal computer) 38 connected via a control cable 37 to the switching board 34 and via a communication cable 39 to the unbalanced type equipment 36, wherein the switching board 34 comprises a near (measuring)-end terminal box 32 having a switch circuit connected at a the near-end to conductors 40 of a balanced pair type cable 31, and a far-end terminal box 33 having a switching circuit connected at a far-end to the conductor 40 of the balanced pair type cable 31. The balanced type equipment is provided with a signal terminal and a ground terminal connected to an inner conductor and an outer conductor of the coaxial cable 35, so that any one of the balanced pairs and a conductor are selected from the conductors 40 to be connected to the coaxial cable 35 by the switching circuit of the near-end terminal box 32, while the far-end terminal box 33 is provided with terminals connected to the conductors 40, among which one balanced pair selected is opened or short-circuited by the switching circuit. Thus, the unbalanced circuits as shown in FIGS. 4A to 4C are obtained by the switching circuits in the near-and far-end switching boxes 32 and 33.

In operation, the switching circuits of the near-and far-end terminal boxes 32 and 33 are controlled by the computer 38. Thus, one of the unbalanced circuits as shown in FIGS. 4A to 4C are obtained. Then, the unbalanced type equipment 36 measures input impedance and admittance to be supplied to the computer 38, in which the measured values are stored.

Figure 8A:
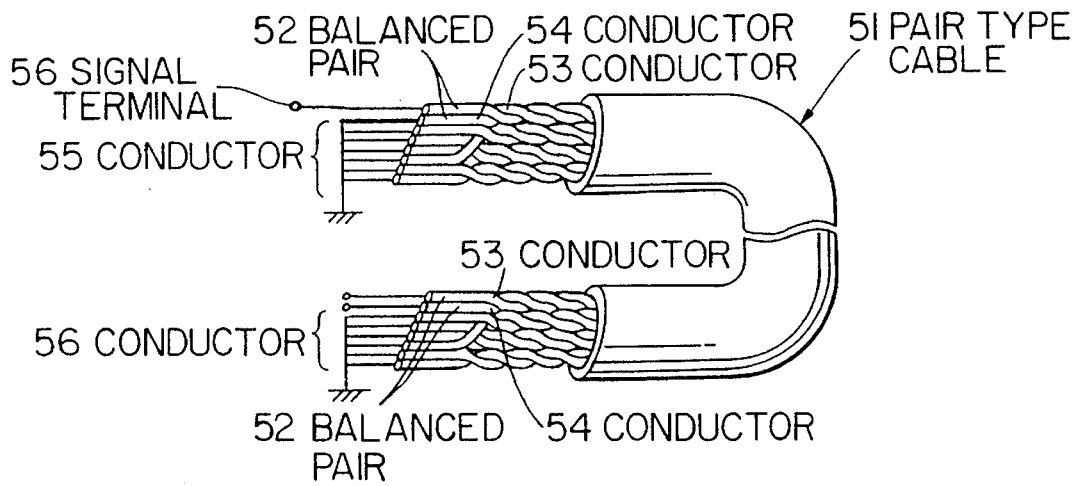
FIGS. 8A to 8C are explanatory views showing the first to third terminated states in the second preferred embodiments.
Figure 8B:
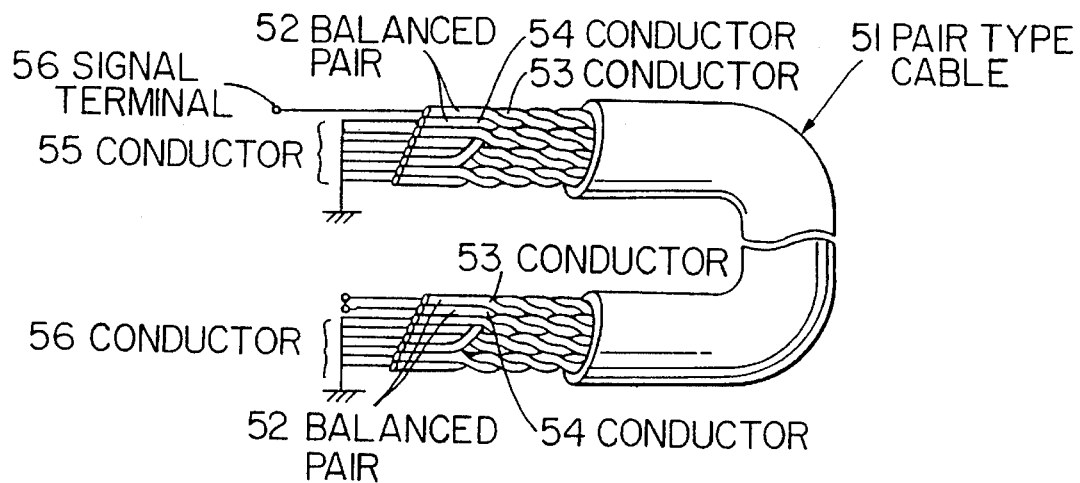
Figure 8C:
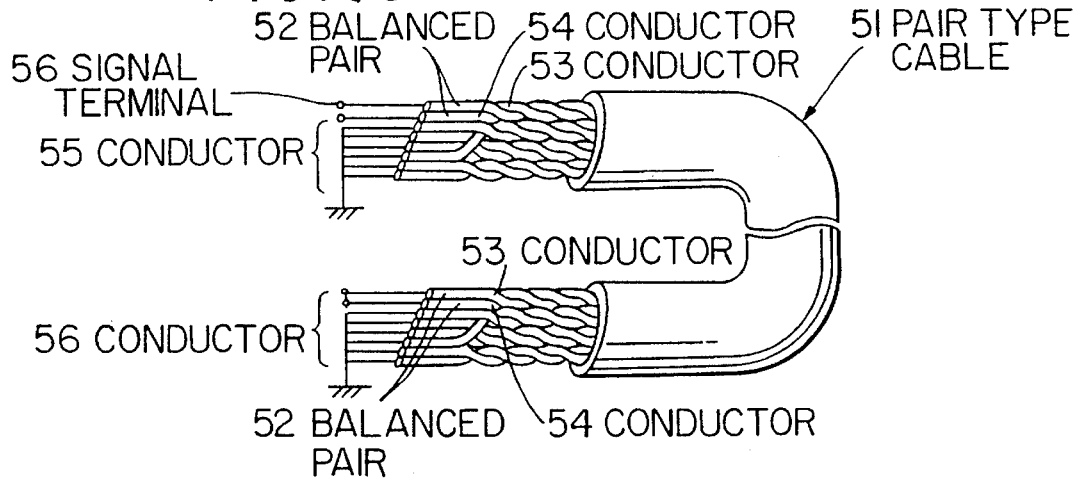

FIGS. 8A to 8C show operation of the switching board 34 comprising the near-and far-end terminal boxes 32 and 33.

(1) the first terminated state

In FIG. 8A, a balanced pair 52 comprising a first conductor 53 and a second conductor 54 are included together with other conductors 55 in a pair type cable 51. The first conductor 53 is connected via the near-end terminal box 32 (in FIG. 7) to the signal terminal 56 of the unbalanced type equipment 36 (in FIG. 7), and the second conductor 54 and the other conductors 55 are connected to ground (the same potential as the ground terminal), respectively, at the near-end. At the far-end, the first and second conductors 53 and 54 are short-circuited by the far-end terminal box 33, and the other conductors 55 are connected together to be open.

(2) the second terminated state

In FIG. 8B, the first conductor 53 is connected to the signal terminal 56, and the second conductor 54 and the other conductors 55 are connected to ground (the same potential as the ground terminal), respectively, at the near-end. At the far-end, the conductors 53 and 54 are open, and the other conductors 55 are connected together to be open.

(3) the third terminated state

In FIG. 8C, the first and second conductors 53 and 54 are connected to the signal terminal 56, and the other conductors 55 are connected to ground (the same potential as the ground terminal), respectively, at the near-end. At the far-end, the first and second conductors 53 and 54 are short-circuited, and the other conductors 55 are connected together to be open.

As described above, the transmission parameters of the balanced pair 52 are measured in the second preferred embodiment in accordance with the first to third terminated states by using the unbalanced type equipment 36.

A method for measuring transmission parameters of a balanced pair in the third preferred embodiment according to the invention will be explained.

As described before, the first to fourth terminated sates are shown in FIGS. 6A to 6D. In the first to fourth terminated states, the aforementioned four input admittances Y'fs, Yff, Yuf and Yus are measured to be substituted into the equations (26) and (27).

$$\frac{1}{Zb} = Yb = \sqrt{\left(Yff - \frac{1}{4}Yuf\right)\left(Yfs - \frac{1}{4}Yus\right)} \quad (26)$$

$$\gamma b = \frac{1}{L}\tanh^{-1}\sqrt{\frac{Yff - \frac{1}{4}Yuf}{Yfs - \frac{1}{4}Yus}} \quad (27)$$

Consequently, a characteristic impedance Zb and a propagation constant γb are obtained by using a unbalance type equipment.

In the same manner as in the second preferred embodiment, the system as shown in FIG. 7 is used in the third preferred embodiment.

FIGS. 9A to 9D show the first to fourth terminated states in the third preferred embodiment according to the invention.

(1) the first terminated state

Figure 9A:
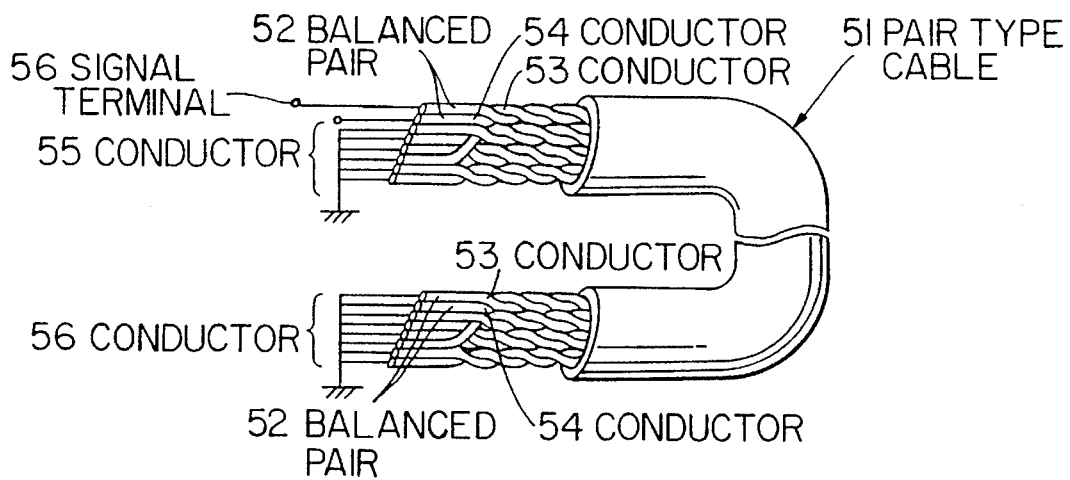
FIGS. 9A to 9D are explanatory views showing the first to fourth terminated stated in the third preferred embodiment.

In FIG. 9A, a pair type cable 51 comprises a predetermined number of balanced pairs, one of which is a balanced pair 52 comprising a first conductor 53 and a second conductor 54, and the others of which are balanced pairs composed of conductors 55. The first conductor 53 is connected via the near-end terminal box 32 to the signal terminal 56 of the unbalanced type equipment 36 (in FIG. 7), and the second conductors 54 and the other conductors 55 are connected together to ground (the same potential as the ground terminal), respectively, at the near-end. At the far-end, the first and second conductors 53 and 54, and the other conductors 55 are connected together to be short-circuited.

(2) the second terminated state

Figure 9B:
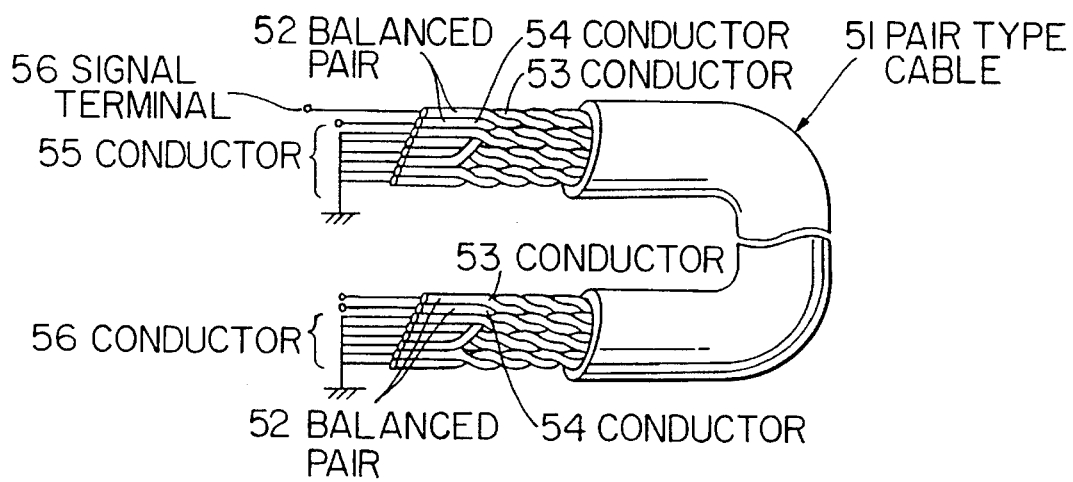

In FIG. 9B, the first conductor 53 is connected to the signal terminal 56, and the second conductor 54 and the other conductors 55 are connected together to ground, respectively, at the near-end. At the far-end, the first and second conductors 53 and 54 are open, and the other conductors 55 are connected together to be open.

(3) the third terminated state

Figure 9C:
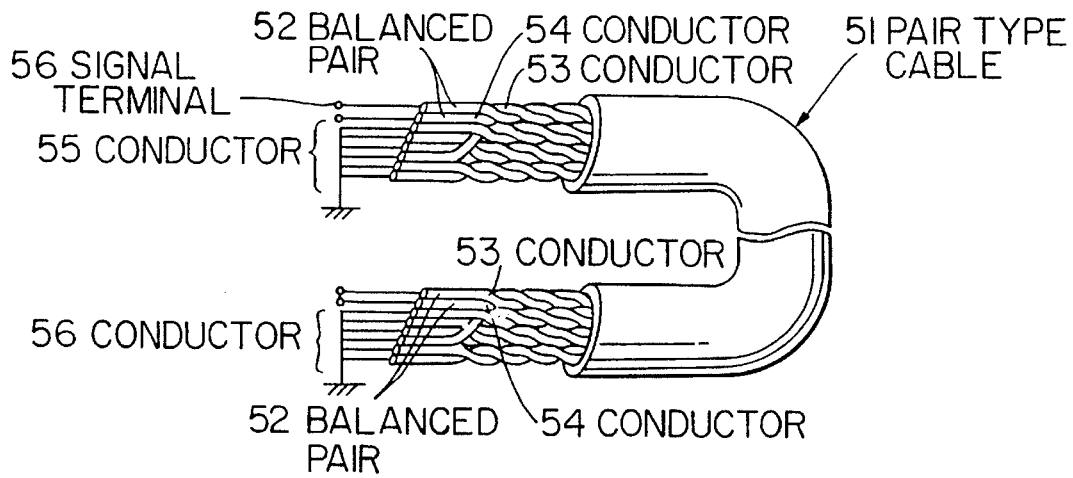

In FIG. 9C, the first and second conductors 53 and 54 are connected to the signal terminal 56, and the other conductors 55 are connected together to ground, respectively, at the near-end. At the far-end, the first and second conductors 53 and 54 are short-circuited, and the other conductors 55 are connected together to be open.

(4) the fourth terminated state

Figure 9D:
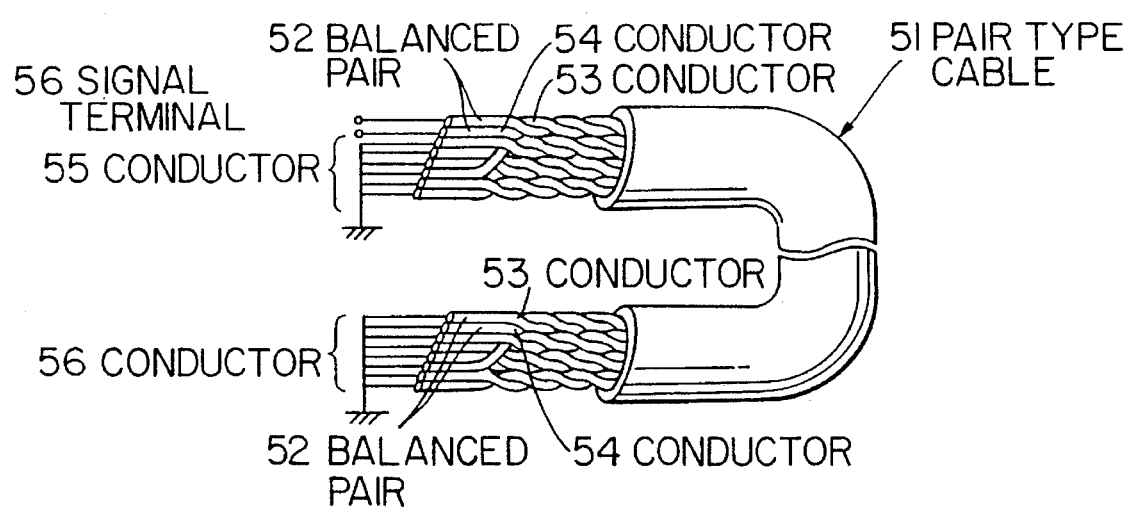

In FIG. 9D, the first and second conductors 53 and 54 are connected to the signal terminal 56, and the other conductors 55 are connected together to ground, respectively, at the near-end. At the far-end, the first and second conductors 53 and 54 and the other conductors 55 are short-circuited.

In the third preferred embodiment, the transmission parameters of a balanced pair can be measured by using a widely used unbalanced type equipment. In principle, the measurement can be carried out even at an upper limit frequency of the unbalanced type equipment. As explained above, an arbitrary balanced pair in the pair type cable comprising a plurality of balanced pairs stranded together is measured. In such a case, if a switching-over apparatus is used as explained in FIG. 7, all balanced pairs are automatically measured in accordance with the switching-over in the switching-over apparatus only by connecting the balanced pairs to terminals of the switching-over apparatus.

As discussed in the first to third preferred embodiments, the below advantages are obtained in the invention.

(1) A widely used unbalanced type equipment can be used.

(2) The measurement is simple, precise, and economical.

(3) The measurement is applicable to a pair type cable for high speed (rate) digital signals, because transmission parameters are measured at a high frequency band. This increases the reliability of high speed digital communication.

Although the invention has been described with the respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for measuring transmission parameters of a balanced pair, comprising the steps of:

connecting a unbalanced terminal of a unbalanced balanced type transformer to a unbalanced type equipment;

opening a balanced terminal of said unbalanced/balanced transformer to measure a balanced terminal-open input admittance Zitf by said unbalanced type equipment;

short-circuiting said balanced terminal to measure a balanced terminal-short input admittance Zits by said unbalanced type equipment;

terminating said balanced terminal with a terminating resistance R to measure a balanced terminal resistance-terminated input impedance Zitr by said unbalanced type equipment;

connecting a balanced pair at a near-end thereof to said balanced terminal to measure a far-end-open input admittance Zitcf by said unbalanced type equipment, said balanced pair being open at a far-end thereof;

short-circuiting said far-end of said balanced pair connected to said balanced terminal to measure a far-end-short admittance Zitcs by said unbalanced type equipment; and calculating a characteristic impedance Zo and a propagation constant $\gamma$ for said transmission parameters in accordance with equations defined below:

$$Z_o^2 = R^2 \left( \frac{Zitr - Zitf}{Zitr - Zits} \right)^2 \cdot \frac{Zitcf - Zits}{Zitcf - Zitf} \cdot \frac{Zitcs - Zits}{Zitcf - Zitf} \quad (14)$$

$$(\tanh \gamma L)^2 = \frac{Zitcf - Zitf}{Zitcf - Zits} \cdot \frac{Zitcs - Zits}{Zitcs - Zitf} . \quad (15)$$

2. A method for measuring transmission parameters of a balanced pair, comprising the steps of:

providing a balanced pair of a length L having a measuring end and a far-end opposite to said measuring end, said balanced pair comprising first and second conductors and contained together with other balanced pairs having remaining conductors in a pair type cable;

providing a unbalanced type equipment having a signal terminal and a ground terminal;

setting said balanced pair to be a first terminated state in which said first conductor is connected to said signal terminal, and said second conductor is connected together with said remaining conductors to said ground terminal, respectively, at said measuring end, while said balanced pair are short-circuited, and said remaining conductors are open, respectively, at said far end, thereby measuring an input admittance Yfs;

setting said balanced pair to be a second terminated state in which said first conductor is connected to said signal terminal, and said second conductor is connected together with said remaining conductors to said ground terminal, respectively, at said measuring end, while said balanced pair and said remaining conductors are open at the far-end, thereby measuring an input admittance Yff;

setting said balanced pair to be a third terminated state in which said first and second conductors are connected to said signal terminal, and said remaining conductors are connected to said ground terminal, respectively, at said measuring end, while said first and second conductors are short-circuited, and said remaining conductors are open, respectively, at said far-end, thereby measuring an input admittance Yuf; and calculating a characteristic impedance Zb and a propagation constant $\gamma b$ for said transmission parameters in accordance with equations defined below:

$$\frac{1}{Zb} = Yb = \sqrt{\left( Yff - \frac{1}{4} Yuf \right)\left( Yfs - \frac{1}{4} Yus \right)} \quad (21)$$

$$\gamma b = \frac{1}{L} \tanh^{-1} \sqrt{\frac{Yff - \frac{1}{4} Yuf}{Yfs - \frac{1}{4} Yus}} . \quad (22)$$

3. The method as defined in claim 2, further comprising the steps of:

providing a measuring circuit switching board having conductor-side terminals, equipment-side terminals, and a switch for switching-over connections of said conductor-side terminals relative to said equipment-side terminals;

connecting said balanced pair and said remaining conductors to said conductor-side terminals, and said equipment-side terminals to said signal and ground terminals; and switching-over said connections in accordance with said first to third terminated states to measure said input admittances Yfs, Yff and Yuf.

4. A method for measuring transmission parameters of a balance pair, comprising the steps of:

providing a balanced pair of a length L having a measuring end and a far-end opposite to said measuring end, said balanced pair comprising first and second conductors and contained together with other balanced pairs having remaining conductors in a pair type cable;

providing a unbalanced type equipment having a signal terminal and a ground terminal;

setting said balanced pair to be a first terminated state in which said first conductor is connected to said signal terminal, and said second conductor is connected together with said remaining conductors to said ground terminal, respectively, at said measuring end, while said balanced pair and said remaining conductors are short-circuited at said far end, thereby measuring an input admittance Y'fs;

setting said balanced pair to be a second terminated state in which said first conductor is connected to said signal terminal, and said second conductor is connected together with said remaining conductors to said ground terminal, respectively, at said measuring end, while said balanced pair and said remaining conductors are open at the far-end, thereby measuring an input admittance Yff;

setting said balanced pair to be a third terminated state in which said first and second conductors are connected to said signal terminal, and said remaining conductors are connected to said ground terminal, respectively, at said measuring end, while said first and second conductors are short-circuited, and said remaining conductors are open, respectively, at said far-end, thereby measuring an input admittance Yuf;

setting said balanced pair to be a fourth terminated state in which said first and second conductors are connected to said signal terminal, and said remaining conductors are connected to said ground terminal, respectively, at said measuring end, while said first and second conductors and said remaining conductors are short-circuited at the far-end, thereby measuring an input admittance Yus; and calculating a characteristic impedance Zb and a propagation constant $\gamma b$ for said transmission parameters in accordance with equations defined below:

$$\frac{1}{Zb} = Yb = \sqrt{\left(Yff - \frac{1}{4} Yuf\right)\left(Yfs - \frac{1}{4} Yus\right)} \quad (26)$$

$$\gamma b = \frac{1}{L} \tanh^{-1} \sqrt{\frac{Yff - \frac{1}{4} Yuf}{Yfs - \frac{1}{4} Yus}} \quad (27)$$

5. The method as defined in claim 4, further comprising the steps of:

providing a measuring circuit switching board having conductor-side terminals, equipment-side terminals, and a switch for switching-over connections of said conductor-side terminals relative to said equipment-side terminals;

connecting said balanced pair and said remaining conductors to said conductor-side terminals, and said equipment-side terminals to said signaled and ground terminals; and switching-over said connections in accordance with said first to forth terminated states to measure said input admittances Y'fs, Yff, Yuf and Yus.

* * * * *